US010802588B2

(12) United States Patent
Martin

(10) Patent No.: US 10,802,588 B2
(45) Date of Patent: Oct. 13, 2020

(54) DEFLECTING FILM WITH MECHANICAL PROTRUSION FOR ACTUATION AND TACTILE FEEDBACK

(71) Applicant: QUALCOMM Incorporated, San Diego, CA (US)

(72) Inventor: Russel Allyn Martin, Menlo Park, CA (US)

(73) Assignee: QUALCOMM Incorporated, San Diego, CA (US)

(*) Notice: Subject to any disclaimer, the term of this patent is extended or adjusted under 35 U.S.C. 154(b) by 1231 days.

(21) Appl. No.: 14/857,604

(22) Filed: Sep. 17, 2015

(65) Prior Publication Data

US 2017/0084816 A1 Mar. 23, 2017

(51) Int. Cl.
| | |
|---|---|
| *G08B 6/00* | (2006.01) |
| *G06F 3/01* | (2006.01) |
| *G09B 21/00* | (2006.01) |
| *B81B 3/00* | (2006.01) |
| *F03G 7/00* | (2006.01) |

(52) U.S. Cl.
CPC ............ *G06F 3/016* (2013.01); *B81B 3/0021* (2013.01); *F03G 7/005* (2013.01); *G08B 6/00* (2013.01); *G09B 21/004* (2013.01)

(58) Field of Classification Search
CPC .............................. G06F 3/016; B81B 3/0021
See application file for complete search history.

(56) References Cited

U.S. PATENT DOCUMENTS

| | | | |
|---|---|---|---|
| 7,612,953 B2 | 11/2009 | Nagai et al. | |
| 2001/0007245 A1* | 7/2001 | Weichart ........... | H01J 37/32091 118/723 MW |
| 2002/0050769 A1* | 5/2002 | Pelrine ................. | F04B 35/00 310/363 |
| 2004/0008853 A1* | 1/2004 | Pelrine ................. | F04B 43/09 381/191 |
| 2004/0056742 A1* | 3/2004 | Dabbaj ................. | H02N 1/006 335/78 |
| 2004/0108479 A1 | 6/2004 | Garnier et al. | |
| 2008/0264058 A1 | 10/2008 | Broer et al. | |
| 2009/0130423 A1 | 5/2009 | Keady | |
| 2010/0007245 A1* | 1/2010 | Jager ..................... | B32B 27/28 310/330 |

(Continued)

OTHER PUBLICATIONS

International Search Report and Written Opinion—PCT/US2016/048245—ISA/EPO—dated Dec. 14, 2016.

*Primary Examiner* — Thomas M Dougherty
*Assistant Examiner* — Karen B Addison
(74) *Attorney, Agent, or Firm* — Holland & Hart LLP

(57) ABSTRACT

Methods, systems, and apparatuses for micro actuators are presented. In some embodiments, a micro actuator can comprise a substrate coupled to an actuation member. A corrugating portion of the substrate in a first state can be uncontracted to form a substantially planar surface and in a second state can be contracted along a dimension parallel to the planar surface. The actuation member can be at least partially rigid. The micro actuator can be configured to move the actuation member relative to the corrugating portion upon a change in state of the corrugating portion. At least a layer of the substrate can be unitary and the actuation member can include at least a portion of the layer. The substrate can comprise a conducting polymer film.

21 Claims, 14 Drawing Sheets

(56) References Cited

U.S. PATENT DOCUMENTS

| | | |
|---|---|---|
| 2011/0209337 A1 | 9/2011 | Pei et al. |
| 2012/0126959 A1 | 5/2012 | Zarrabi et al. |
| 2013/0207793 A1* | 8/2013 | Weaber ................. G06F 1/1626 |
| | | 340/407.2 |
| 2015/0214860 A1 | 7/2015 | Tanaka |

* cited by examiner

400

800

DEFLECTING FILM WITH MECHANICAL PROTRUSION FOR ACTUATION AND TACTILE FEEDBACK

BACKGROUND

Aspects of the disclosure relate to an improved micro actuator.

Tactile feedbacks systems can be used in a variety of applications to provide users with physical sensations and/or indications. One common example of a tactile feedback device is a braille machine for the sight impaired. Refreshable braille machines have been developed to allow sight impaired individuals to read, interact, and communicate with others using an electromechanical interface. Additional tactile feedback system examples are vibration feedback features of game controllers, vehicle steering wheel feedback systems to stimulate or signal drivers, flight or entertainment simulators with feedback forces in controls or in the platform that the user rests upon, and mobile phone vibration mechanisms.

A wide range of technologies have been developed to enable the electromechanical functionality of these devices including electromagnetic and piezoelectric devices. Each of these technologies provide several benefits and shortcomings, especially when integrated in smaller mobile devices. Electromagnetic devices, such as devices using electromagnetic fields to actuate permanent magnets attached to tactile elements, can be used to create fast acting and relatively inexpensive tactile devices. However, such devices can consume relatively large amounts of power to change and/or maintain states. Additionally, electromagnetic devices such as these may not scale well to smaller sizes, limiting their applicability.

Piezoelectric devices take advantage of piezoelectric effects to generally form bendable "arms." Piezoelectric devices use crystalline structures that compress or decompress upon application of electricity. When integrated on opposing sides of an arm structure, one side can be compressed and the other side expanded to cause a bending motion. These devices can be power efficient, but can also be relatively expensive and fragile. These drawbacks limit their applicability, especially as tactile feedback systems are being used in increasing space confined areas, such as mobile electronics. Additional types of tactile feedback systems can use mechanically unbalanced electric motors to create a vibration force. However, as such systems are limited to creating vibrations, their uses as data delivery vehicles is limited.

Accordingly, a need exists for an improved micro actuator for use with tactile feedback or other applications.

BRIEF SUMMARY

Methods, systems, and apparatuses are described for an improved micro actuation device.

In some embodiments, a micro actuator can comprise a substrate coupled to an actuation member. A corrugating portion of the substrate in a first state can be uncontracted to form a substantially planar surface and in a second state can be contracted along a dimension parallel to the planar surface. The actuation member can be at least partially rigid. The micro actuator can be configured to move the actuation member relative to the corrugating portion upon a change in state of the corrugating portion. At least a layer of the substrate can be unitary and the actuation member can include at least a portion of the layer. The substrate can comprise a conducting polymer film.

In further embodiments, the micro actuator can further comprise a plurality of electrodes and application of electrical power across electrodes of the plurality of electrodes can cause a change in state of the corrugating portion of the substrate. Electrodes of the plurality of electrodes can be arranged on the substrate on opposing sides of the actuation member. The force imparted to move the actuation member can be dependent upon at least a ratio of corresponding dimensions of the corrugating portion to the substrate. The actuation member can move in a direction substantially parallel to the planar surface.

In further embodiments, the actuation member can be coupled to the substrate at two points and extends in a direction substantially oblique or normal to the planar surface. The substrate can includes a first layer, a second layer, and a tertiary layer. The substrate can be configured to induce an electrical charge on the first layer or the second layer when a voltage difference is applied between the first layer and the second layer and the tertiary layer can be disposed between the first and second layer. The first layer or the second layer can be configured to expand or contract upon an application of an electric charge between the first layer and the second layer. The first layer can be divided into a plurality of electrically isolated portions. The thickness of the substrate can be less than three hundred microns. The micro actuator can be biased for the corrugating portion to be in the first state or the second state. The substrate can define one or more voids.

BRIEF DESCRIPTION OF THE DRAWINGS

Aspects of the disclosure are illustrated by way of example. In the accompanying figures, like reference numbers indicate similar elements.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Figure 1:
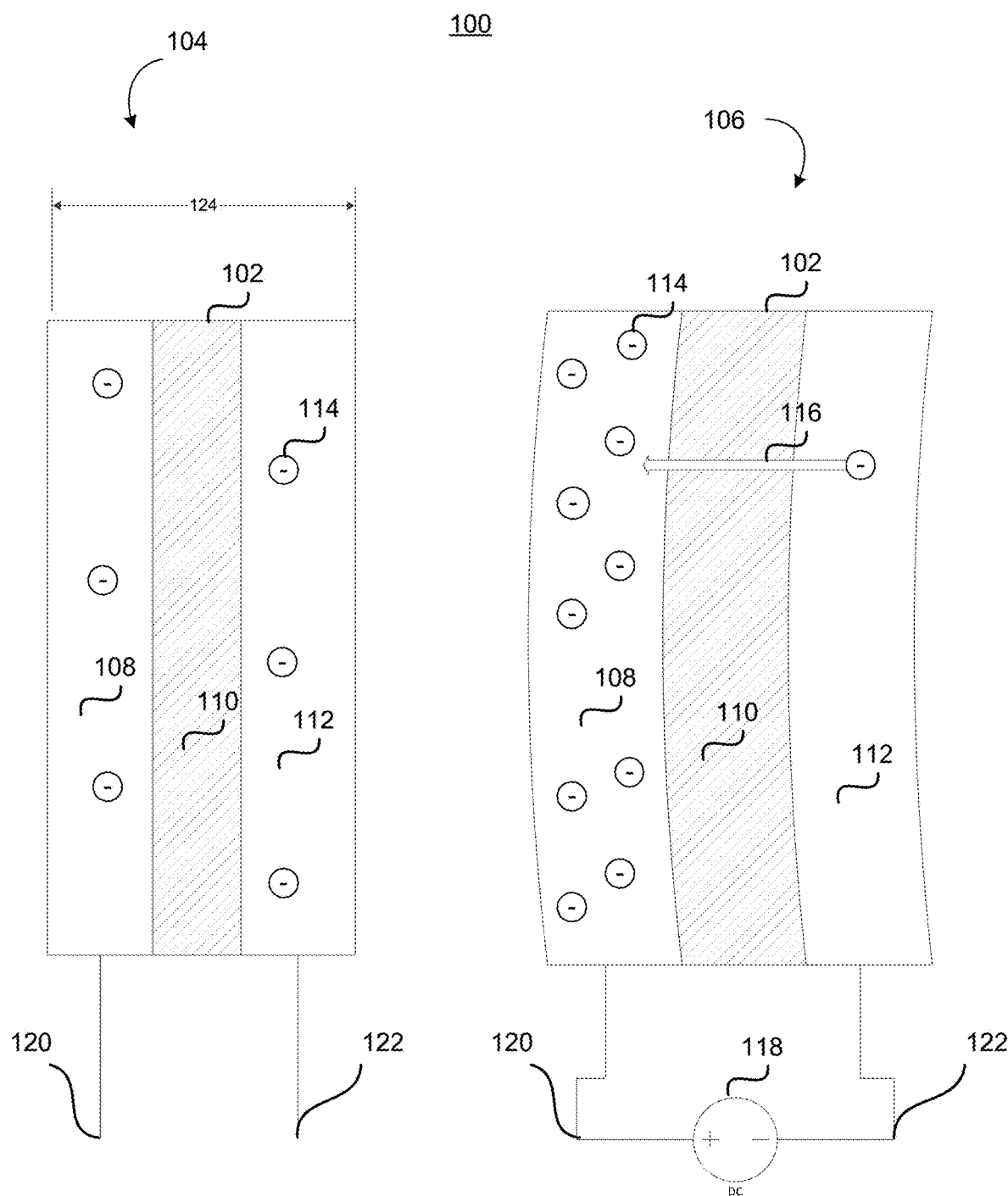
FIG. 1 illustrates a simplified diagram of an electromechanically actuating arm.

FIG. 1 illustrates a simplified diagram of a system 100 that may incorporate one or more embodiments. This system illustrates two states of an electromechanical actuating arm 102. The arm 102 can be created by layering certain materials with a separation layer. When electrical power is applied to the arm 102, the arm can bend due to electromechanical features of the structure. In a first state 104, the arm has no electrical power applied to electrodes 120 and 122. In the first state 104, the arm is illustrated as being straight and unbent. In the second state 106, electrical power can be applied to the arm 102 to cause the arm to bend, as illustrated. In this illustration, the arm bends to the right, but the polarity of the voltage source 118 can be reversed to cause a reverse bending motion.

Also illustrated are anions 114. In the first state 104, the anions 114 are relatively uniformly distributed in conductive layers 108 and 112. The conductive layers 108 and 112 can be electrically and ionically conducive. Separation layer 110 can be a dielectric, an electrolyte, and/or can be electrically insulating and ionically conductive. In the second state, conductive layer 108 is illustrated as containing relatively more anions 114 than conductive layer 112. The migration 116 of anions between the materials can be induced through several processes, but the end results are similar. By inducing more anions into layer 108, the anions 114 can repel each other and the conductive layer can 108 expand. Conversely, the lack of anions in the conductive layer 112 can cause the conductive layer 112 to contract. These expansion and contraction forces can cause the arm 102 to bend and therefore the structure can be used as an electromechanical actuator by creating a mechanical bending force in response to electrical power.

As stated previously, the separation layer 110 can be a dielectric or an electrolyte. It is believed that when the separation layer 110 is a dielectric, the arm 102 acts as a capacitor. When the electrical power source 118 is applied to the arm 102, the positive charge of the power source 118 attracts negatively charged anions. Conversely, the negative charge of the power source 118 repels anions. In this manner, anions can be attracted to conductive layer 108. Alternatively, the separation layer 110 can be an electrolyte. In such a configuration, a smaller potential may be required to unbalance the anions of the conductive layers 108 and 112.

The system 100 illustrated in FIG. 1 can be manufactured on a miniscule scale using, for example, thick film, thin film, or MEMS technologies. For example, conductive layers 108 and 112 can be manufactured from a conducting polymer. Conducting polymers are advantageously inexpensive and flexible. Using conducting polymers, or similar materials, the arm 102 can be made into a film. The thickness 124 of the film can be between five and two hundred microns. Other technologies can additionally or alternatively be used to implement micro actuators similar in operation to those disclosed. For example, the previously mentioned piezoelectric materials can be used to cause a bending motion by inducing crystalline structures to expand or contract on alternate layers of a film. Thermally reactive materials can also be used that either expand or contract in response to applied or removed thermal energy. Thermal energy can be applied or removed using a variety of methods including the use of electrical heating elements, and/or Peltier devices.

Figure 2:
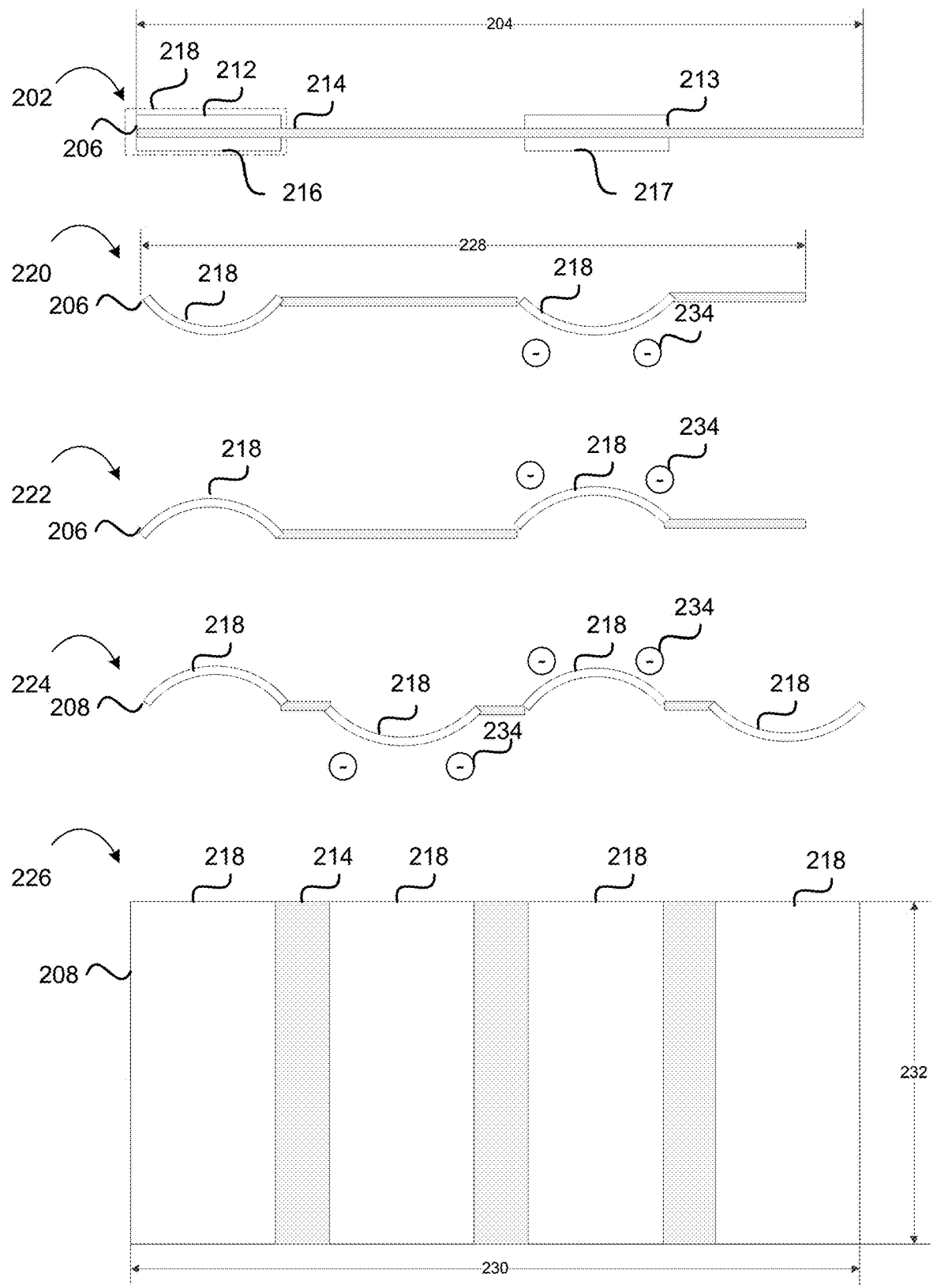
FIG. 2 illustrates configurations of electromechanically actuating film devices.

FIG. 2 illustrates a simplified diagram of various alternative configurations 200 that may incorporate one or more embodiments. The system illustrates a system similar in operation to the arm 102 of FIG. 1. The configurations and states illustrated 200 can use the film materials discussed to form conductive layers and a separation layer. Configuration 206 illustrates a generic device that can be comprised of film layers. Layers 212 and 216 illustrate conductive layers similar to the conductive layers 108 and 112 of FIG. 1. Separation layer 214 illustrates a layer similar to the separation layer 110 of FIG. 1. However, unlike the system 100 of FIG. 1, the configuration 206 of FIG. 2 contains multiple distinct and separate sections of conductive material. For example, separate conductive sections are labeled 213 and 217. By overlaying a separation layer 214 with distinct and separate layers of conductive materials, multiple actuation sections can be created from the separate sections of conductive material. For example, actuation section 218 can act similar to the system 100 of FIG. 1.

In view 202, the device can be unpowered and somewhat equivalent to the first state 104 of FIG. 1. In this state the device 206 can form a substantially planar surface with a set length 204 of the film in a direction parallel to the planar surface. To better understand this configuration, views 202, 220, and 222 are provided as additional side views of the device 206. Views 224 and 226 are of an improved device that will be discussed herein.

Views 220 and 222 illustrate the device 206 after electrical power is applied to actuation sections 218. When power is applied to the actuation section, each section can bend as described during the functioning the system of FIG. 1. This bending/actuation of the actuation sections 218 can cause the device 206 to corrugate/fold and therefore contract along the dimension 228. Therefore, the length 228 can be less than the length 204 for the same device 206, depending upon the powered or unpowered state of the device 206. The device 206 can therefore act somewhat analogous to an accordion and contract upon application of electrical power. Anions 234 are provided to illustrate the direction of charge for each view. It should be noted that the views 220 and 222 can be of the same device 206 illustrated by view 202 with the only difference between view 220 and 222 being the polarity of power applied to the conductive layers 212 and 216. Conductors (not shown) can be used to provide electrical paths to the conductive layers 212 and 216 to a power source (not shown).

View 224 illustrates a side view of an improved device 208 that contains alternating polarity actuation section 218. By alternating the polarities, the actuation sections can be spaced closer together. By alternating polarities of adjacent actuation section 218, concurrent actuation sections can bend in opposing directions forming the wave-like profile of the device 208 illustrated.

View 226 illustrates an example top view of device 208. The top view is provided to further illustrate the planar shape of the device 208 when voltage is not applied to the actuation sections 218. Additionally, view 226 is provided to illustrate that manufacturing of the device can be accomplished relatively inexpensively. For example, an intermediate layer can be striped with conductive layers 212 and 216 on top and bottom along the dimension 232. In this manner, several distinct actuation sections 218 can be formed on the device 208.

The configurations of FIG. 2 enable an inexpensive and miniscule micro actuator useful for generating a pulling force along dimensions 204 or 230. However, the configurations of FIG. 2 have several shortcomings. The devices are limited in the amount of actuation force that can be provided. Although the force can be increased by layering like devices, the layers presents new problems given the nature of the device. For example, space must be provided between subsequent layered devices to enable the corrugation of each device when electrical power is applied. The actuation force provided by each device is also limited to a pulling force, such as when two sides of the device are anchored. Many haptic feedback devices operate using pushing force (such as actuating a braille dot) and therefore additional structures may be needed to change the direction of the actuation force. These additional structures can add space and cost to the design, eliminating some advantages of the micro structure. When attempting to create an array of these devices for tactile feedback, these shortcomings and additional structures become increasingly impedimental.

Disclosed are applications for micro tactile feedback systems including several wearable devices using features of the disclosed embodiments. These wearable devices can be used for medical devices, such as wearable patches for example. As one example, a patch can take the form of a glucose level detector using a non-obtrusive or other sensor to ascertain the level of glucose of the user. The haptic feedback device can be used to signal the user using a micro actuator when the user's glucose falls outside of an acceptable range in order to signal the user to take appropriate actions, such as to ingest sugar or inject glucose. This concept can be used in several alternate situations. For example, a blood alcohol level patch can be used to signal a user when it is unsafe to drive. A timer can be attached to a patch to indicate to a user when to ingest a medication. The patch can be used to detect unsafe level of radiation or poisons in settings such as a mine or a hazardous waste cleanup area. Alternatively, an oxygen sensor can be tied to such a device for use in deep sea, space exploration, or like instance to signal to the user that the oxygen level has fallen below an acceptable threshold. Although a patch is discussed in the preceding, it should be understood that similar functionality can be implemented using several different implementations. For example, a band can be used that can be worn around a wrist. Alternatively, a glove can be worn to take advantage of the sensitivity of human fingertips.

Additionally functionality outside the medical realm is also envisioned. Aids for sight impaired and other individuals is an area wherein such devices can have a meaningful impact. One implementation could be the use of an actuation device for a braille reader. Braille readers/keyboards are commonly used by sight impaired individuals to interact with electronic terminals or like devices. The keyboards can be refreshable in order to scroll braille messages across the keyboard. Additionally, the keyboard can adjust displayed braille characters according to context provided by the electronic terminal. The braille keyboard can also implement sensors such that haptic "keys" can be formed for the user allowing the user to output data to the electronic terminal.

Although braille is given as an example, other pictures or characters can be presented. Alphanumeric text can be displayed for users to learn braille or for non-braille readers. Such devices can be used in low light conditions, such as movie theaters or subway terminals to display messages to users. Additionally, tactile displays can be used that are adaptable. The tactile displays can display graphics or context sensitive icons. As an example, a ticket dispenser for a subway or like station can be implemented wherein the display can be altered depending upon current conditions of the railway network or pricing structure. As another example, a "universal" remote control can be implemented with adaptable haptic feedback displays that can be used in low light conditions of a movie setting. Alternatively, applications can be used to provide additional information to a user when audio or visual devices are insufficient. Examples of these application can be for aircraft and automobile operation. In these instances, the haptic feedback can be used to indicate environmental conditions, directions, emergency information, or other information to the user. For example, a steering wheel can signal a user using haptic feedback when the automobile detects that the user is drowsy, departing a lane, or approaching a vehicle too quickly. In an aircraft, the haptic feedback can signal turbulence conditions or warnings to military aircraft.

Likewise, the micro actuator can be implemented in a glove-like device in order to create an interactive and adaptable user interface. Using such a device, the tactile response can change depending upon a detected change in position of the glove. For example, the user can suspend their gloved hand in front of a display. Depending upon the location of the glove in relation to the display, the glove can alter haptic feedback to the user. For example, the display may include user selectable icons on a GUI that can be selected via the movement of the glove. The haptic feedback can be used to signal to the user when the gloved hand is in position to select an icon. Such a glove can also be integrated with sensors or other devices to provide additional information to a user. For example, a navigation system can be implemented using the glove. The glove can include one or more haptic actuators in the palm area of the glove that can provide directional information to a user, especially for sensory impaired individuals. Such a glove could also be used as a sort of mobile keyboard for the sight impaired and may be able to translate text through the additional use of a vision system.

The haptic feedback devices can also be integrated into other articles of clothing. A jacket or like article of clothing can be worn with an array of haptic actuators integrated to contact the back or other areas of a user. Such a device can be used for the sight impaired in order to relay information including navigation instructions, environmental information, advertisements, stock information, etc. Additionally, the wearable technology can be used in conjunction with a glove or other haptic device.

An increasingly popular application of haptic feedback actuators is use with mobile electronic devices, such as smartphones. Smartphones can utilize haptic feedback technology to implement braille displays, create interactive notification icon(s), or for other purposes. An interactive notification icon can provide tactile feedback indicative of an email, missed call, text message, or other. In this manner, a user can be notified of such an indication by simply reaching into their pocket as opposed to activating a smartphone's screen. Such a device can save mobile device power and can be useful in situations such as when the user is in a meeting, watching a movie, or use of the phone's screen would otherwise be disruptive. Likewise, smartwatches can utilize similar functionality. A tactile notification system can be implemented on a smartwatch to be in contact with the user's wrist. The pattern, timing, and/or frequency of tactile actuations can be used to notify the user of several different types of notifications.

Other technological areas can also benefit from the use of features of the disclosure. Microfluidic valves and other such devices can also be improved through the use of the disclosure. Micro actuators can also enable the manufacture and control of micro robotic devices, such as swimming and/or small vessel traversing robots. Such robots can be useful in the medical field, for example, to traverse blood or other vessels. It should be understood that micro actuation technology is an emerging field and likewise there are emerging applications for the disclosed systems and methods.

The systems of FIG. 1 and FIG. 2 have several shortcoming with respect to micro actuators. The disclosed system 100 of FIG. 1 provides limited actuation force and can be difficult to integrate with useable tactile systems due to the geometry of the bending arm. The configurations 200 of FIG. 2 can be used to increase the amount of force imparted by a micro actuator, but the configuration limits the applications of the device. The following disclosure includes several features for creating a highly reliable micro actuator with low power requirements and high relative actuation force that can be manufactured for relatively low cost.

Figure 3:
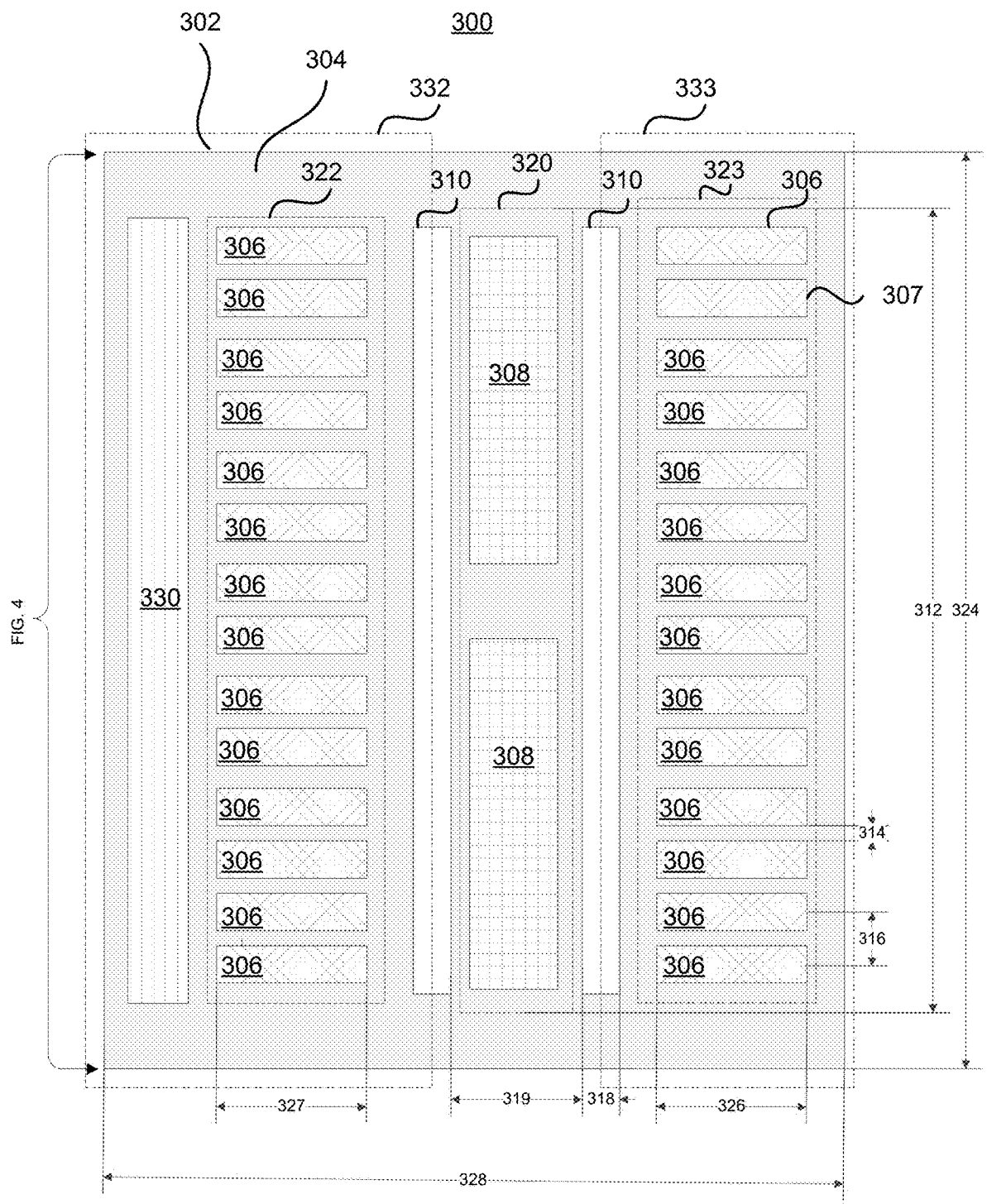
FIG. 3 illustrates a first micro actuator with features of some embodiments of the disclosure.

FIG. 3 illustrates a simplified diagram of a system 300 that may incorporate one or more embodiments. The system 300 illustrates a top view of a micro actuator 302. Although the outline of the actuator 302 is illustrated as a rectangle, it should be understood that the outline can take the shape of a square, circle, polygon, or an irregular shape. The actuator 302 can include a separation layer 304 that can be used to form a substrate. The separation layer 304 can include conductive layer areas 306 that can be arranged in an array, as illustrated. Specifically, two arrays 322 and 323 are illustrated on opposing sides of the actuator 302. Additionally, one or more voids 310 can be defined by the separation layer 304 on either sides of an actuation member 320 portion of the substrate 304. The actuation member 320 can include stiffeners 308 to increase the rigidity of the actuation member.

It should be appreciated that the scale of the actuator 302 can be such that the fabrication and design of such devices becomes increasingly difficult. For example, the distance 314 between conductive layer areas 306 can be less than one hundred microns. The pitch 316 of the conductive layer areas 306 can be less than three hundred microns. The length 312 of the actuation member 320 can be from one to several hundred electrode pitches. The width 318 of a void 310 can be less than five hundred microns.

Figure 4:
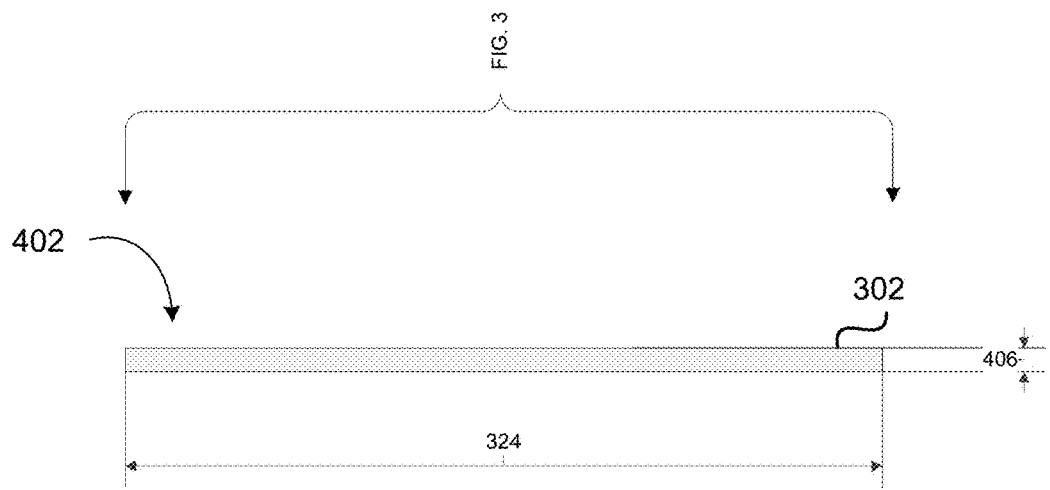
FIG. 4 illustrates a side view of the first micro actuator of FIG. 3, in two states.
Figure 4:
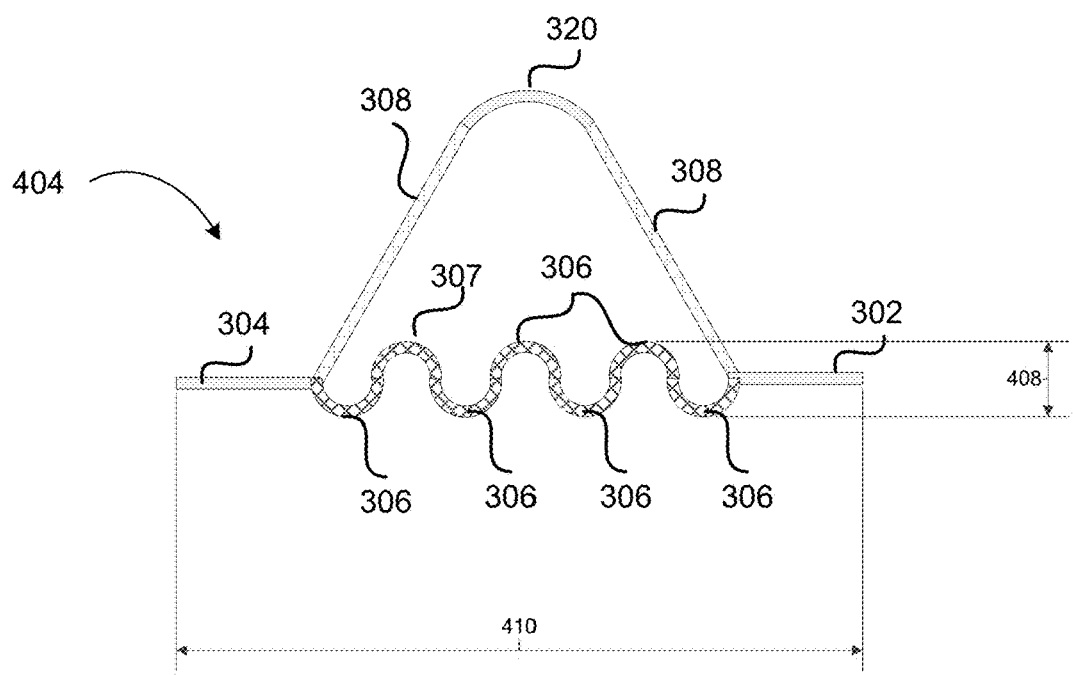

The actuator 302 can be used to extend the actuation member 320 in a direction towards or away from the view illustrated in FIG. 3, as will be better visualized in FIG. 4. The actuation of the device can be accomplished by applying one or more voltages to conductive layer areas 306 of the plurality of conductive layer areas 306 illustrated. Each conductive layer area 306 can act as an electrode. Additionally, the conductive layer areas 306 can be arranged in a linear array 322 and 323 along a dimension of the substrate 304. It should be understood that only one side of the actuator 302 is illustrated. The opposing side can contain corresponding conductive layer areas 306. By applying voltage differences to conductive layer areas 306, the actuator 304 can be activated. Applying alternating polarity voltage to adjacent conductive layer areas 306 can be beneficial. For example, conductive layer area 306 can be positively charged (and the corresponding conductive layer area on the opposite side negatively charged). Conductive layer area 307 can be negatively charged (and the corresponding conductive layer area on the opposite side positively charged). The application of this voltage can cause the actuator 302 to corrugate along dimension 324 in an alternating pattern. The use of alternating polarities of adjacent conductive layer areas 306 can aid in corrugating the portions 332 and 333 of the actuator 302 by influencing them to form a natural, wave-like corrugating pattern. Alternating the polarities, and therefore the direction of the folding material, can therefore prevent the bending areas from fighting against the naturally occurring shape of the corrugated material. The corrugation of portions 332 and 333 can cause the actuator 302 to reduce in length along dimension 324 and fold in on itself. This action can force the actuation member 320 to extend, as it moves relative to the portions 332 and 333 of the actuator 302.

The force of this actuation can depend on several factors including the amount of potential applied across conductive layer areas 306, the materials used to manufacture the device, and/or the width 326 of the conductive layer areas 306. Furthermore, the ratio of the widths (326 and 327) of the conductive layer areas compared to the width 328 of the substrate can be varied to alter the force imparted to the actuation member 320. Increasing this ratio can increase the force imparted. The ratio of the widths (326 and 327) of the conducting layer area(s) 306 to the width 319 of the actuation member 320 can alter the amount of pressure provided by the extension of the actuation member 320.

Returning the actuator 302 to the first state can be accomplished in various ways. A biased material 330 can be integrated into the actuator 302 to impart a return force that can be overcome from the force imparted from the corrugating substrate. Alternatively or additionally, the voltages applied to the conductive layer areas 306 can be varied and/or reversed to return the actuator 302 to the first, uncorrugated state. Alternatively, an external biased device can be used to provide a return force. For example, the actuator 302 can be placed under a membrane or a prebiased button that returns the actuator to its first state when voltage is removed from the conductive layer areas 306, for example.

FIG. 4 illustrated a side view of the actuator 302 of FIG. 3 to better illustrate the operation of the actuator 302. Illustrated are two states of the actuator 302. In the first state 402, voltage is not applied to the conductive layer areas 306. In this state, the actuator 302 can substantially take the form of a planar surface and can be compliant, such as in the form of a film. As such, the actuator 302 can be applied to irregular or curved surfaces.

In the second state 404, electrical power has been applied to the conductive layer areas 306, causing the substrate 304 to corrugate, as illustrated. When corrugated, the actuation member 320 can be deflected upwards (or downwards) from the actuator 302. In other words, the actuation member 320 can be deflected in a direction normal or oblique to the planar surface illustrated by view 402, such as at an angle 60 degrees or less from a reference normal to the planar surface illustrated by view 402. The angle of the deflection can be altered by changing the lengths of the stiffening portions 308. The actuation can be caused by the deformation of the substrate 304 as dimension 324 decreases to dimension 410. The thickness 406 of the substrate 304 can be less than two hundred microns thick. The deflection 408 of the conductive layer areas 306 can be less than one hundred microns.

Using the disclosed configuration has several advantages. First, the device, or a layer of the device, can generally made from a unitary material. A portion of the actuation member 320 can be made unitarily from the same material as the substrate 304. This uniformity of material can increase the strength of the device and can simplify the manufacturing process, lowering production cost. Additionally, because multiple conductive layer areas 306 can be used to extend the actuation member 320, the forces provided by applying a voltage to each conductive layer 306 can be cumulated.

The force exerted by the deflection of the actuation member 320 can therefore be several times the force provided via each conductive layer area 306.

The direction of the force exerted by the actuation member (being away from the substrate) is also advantageous. Whereas the configurations 200 of FIG. 2 can only generate a pulling force between two objects, the actuator 302 can push an object away from the actuator 302. This can simplify the construction of a tactile display, for example, where moveable elements are motivated away from a planar surface (such as an individual braille dot). Also, the actuator 302 need not be anchored on a side of the device, simplifying integration of the actuator 302 into a tactile feedback enabled device. Instead, the stiffening portions 308 can provide structural rigidity necessary to actuate a tactile member.

Figure 5:
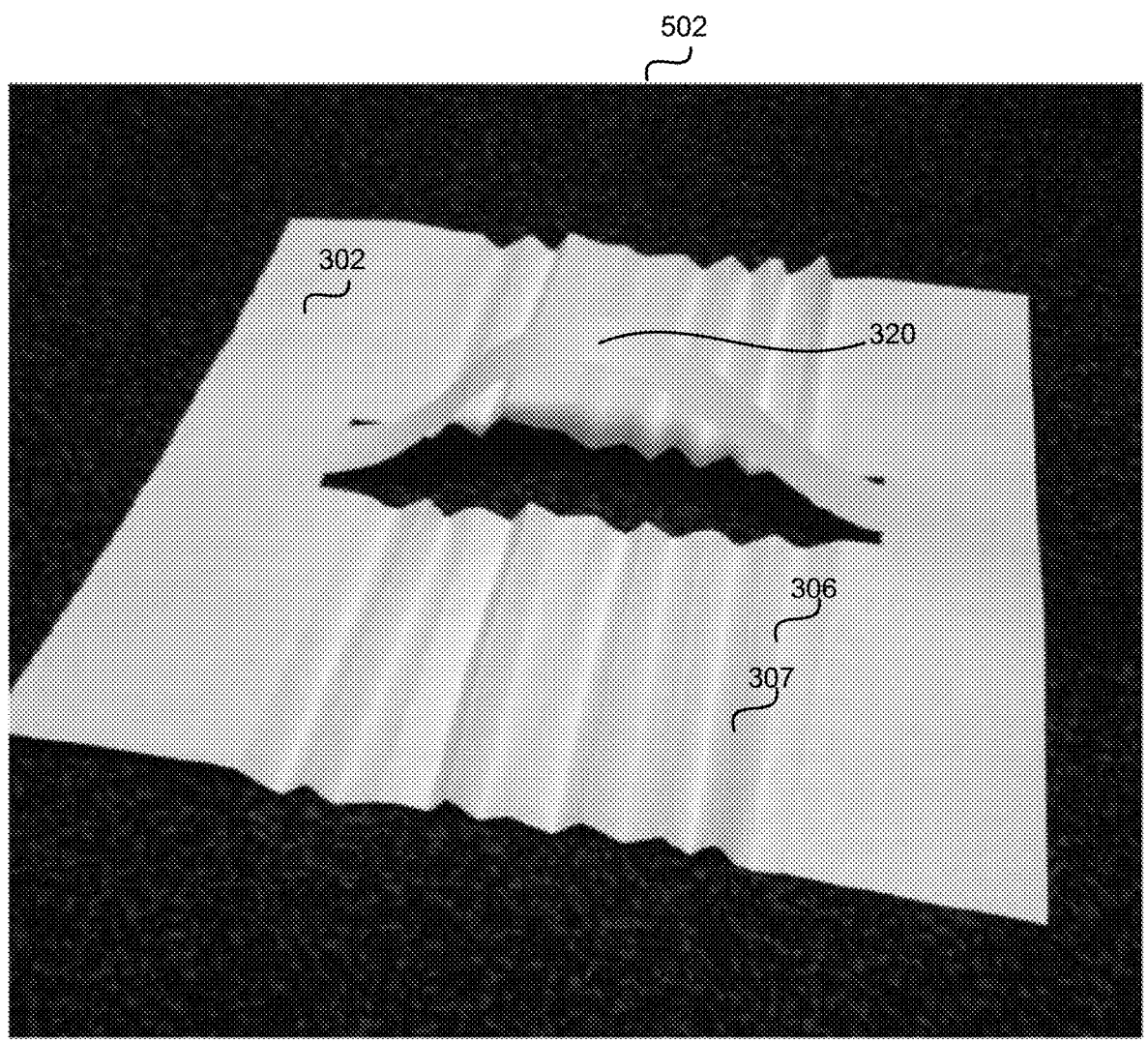
FIG. 5 illustrates a perspective view of the first micro actuator of FIG. 3 in a state.

FIG. 5 illustrates a perspective view 502 of an example model of the actuator 302. The view 502 is included to better understand the functioning of the actuator 302. Additionally, the view illustrates an important aspect of the actuator 302, namely that the extension of the actuation member 320 can be controlled to varying heights. Several methods for controlling the force and deflection of the actuation member 320 are contemplated. For example, voltages can be applied across varying numbers of conductive layer areas 306 to alter the amount of corrugation of the actuator 302 (and therefore the amount of deflection of the actuation member 320). Additionally, the amount of voltage potential across conductive layer areas 306 can be adjusted using traditional method such as linear voltage control or Pulse Width Modulation (PWM). Additionally, the shape and dimensions of the conductive layer areas 306 can be adjusted. For example, the width 326 of one or more conductive layer areas 306 can be increased to increase the amount of force provided to the actuation member 320.

Figure 6:
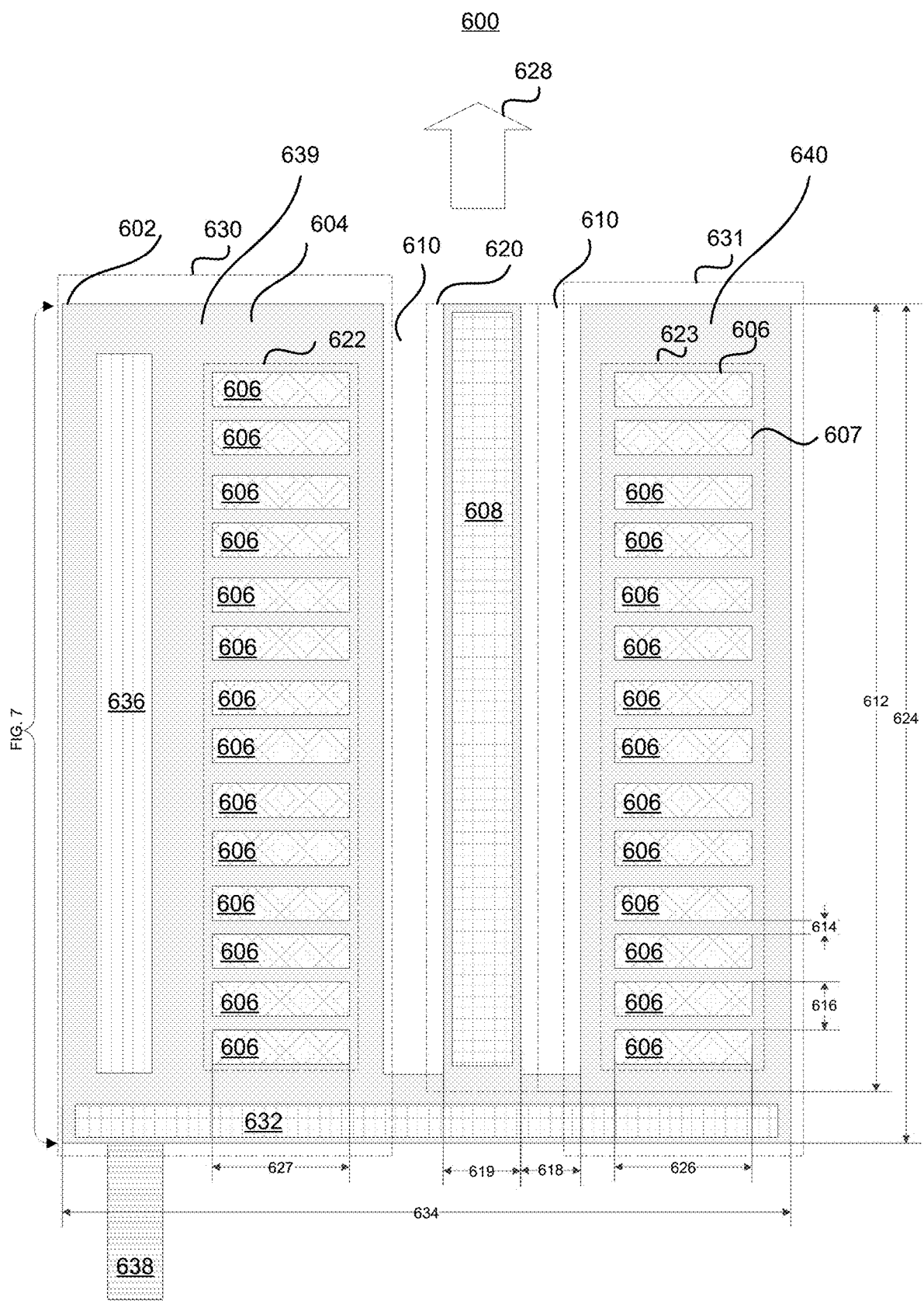
FIG. 6 illustrates a second micro actuator with features of some embodiments of the disclosure.

FIG. 6 illustrates a simplified diagram of a system 600 that may incorporate one or more embodiments. The system 600 illustrates a top view of a micro actuator 602. Although the outline of the actuator 602 is illustrated as a rectangle, it should be understood that the outline can take the shape of a square, circle, polygon, or an irregular shape. The actuator 602 can include a separation layer 604 that can be used to form a substrate. The separation layer 604 can include conductive layer areas 606 that can be arranged in an array, as illustrated. Specifically, two arrays 622 and 623 are illustrated on opposing sides of the actuator 602. Additionally, one or more voids 610 can be defined by the separation layer 604 on either sides of an actuation member 620 portion of the substrate 604. The actuation member 620 can include stiffener(s) 608 to increase the rigidity of the actuation member.

It should be appreciated that the scale of the actuator 602 can be such that the fabrication and design of such devices becomes increasingly difficult. For example, the distance 614 between conductive layer areas 606 can be less than one hundred microns. The pitch 616 of the conductive layer areas 606 can be less than three hundred microns. The length 612 of the actuation member 620 can be from one to several hundred electrode pitches. The width 618 of a void 610 can be less than five hundred microns.

The actuator 602 can be used to extend the actuation member 620 in a direction indicated by arrow 628. The actuation of the device can be accomplished by applying one or more voltages to conductive layer areas 606 of the plurality of conductive layer areas 606 illustrated. Each conductive layer area 606 can act as an electrode. Additionally, the conductive layer areas 606 can be arranged in a linear array 622 and 623 along a dimension of the substrate 604. It should be understood that only one side of the actuator 602 is visualized. The alternate side can contain corresponding conductive layer areas 606. By applying electrical to conductive layer areas 606, the actuator 602 can be activated. Electrical power can be applied to adjacent conductive layer areas 606 with alternating polarity. For example, conductive layer area 606 can be positively charged (and the corresponding conductive layer area on the opposite side negatively charged). Conductive layer area 607 can be negatively charged (and the corresponding conductive layer area on the opposite side positively charged). The application of this voltage difference can cause the linear arrays 622 and 623 to corrugate along dimension 624. Portions 630 and 631 of the actuator 602 can therefore corrugate and reduce in length along dimension 624. This action can force the actuation member 620 to extend in the direction indicated by arrow 628 because the actuation member 620 may not corrugate in response to voltage differences applied to conductive layer areas 606. Additionally, the actuator 602 may be anchored to a fixed reference at points 639 and/or 640 so that the corrugation of portions 630 and 631 "pull" the actuation member 620 towards the fixed reference. This effect can also be enabled due to the separation of the actuation member 620 from the portions 630 and 631 through the use of voids 610, the lack of conductive layer areas 606 on the actuation member 620, and/or the presence of stiffening material 608 on the actuation member 620.

Additional stiffening areas can be added to the actuator 602 (or the actuator 302). As an example, stiffening area 632 is illustrated in FIG. 6 on an edge of actuator 602. The stiffening areas can be added to the edges of the actuator in order, for example, to provide a mounting area for a clamping type of retaining mount. Additionally or alternatively, stiffening areas can be added between conductive layer areas to alter the corrugating action of an actuator.

The force of this actuation can depend on several factors including the amount of potential applied across conductive layer areas 606, the materials used to manufacture the device, and/or the width 626 of the conductive layer areas 606. Furthermore, the ratio of the widths (626 and 627) of the conductive layer areas 606 compared to the width 634 of the substrate can be varied to alter the force imparted to the actuation member 620. Increasing this ratio can increase the force imparted. The ratio of the widths (626 and 627) of the conducting layer area(s) 606 to the width 619 of the actuation member 620 can alter the amount of pressure provided by the extension of the actuation member 620.

Returning the actuator 602 to the first state can be accomplished in various ways. A biased material 636 can be integrated into the actuator 602 to impart a return force that can be overcome from the force imparted from the corrugating substrate. Alternatively or additionally, the voltages applied to the conductive layer areas 606 can be varied and/or reversed to return the actuator 602 to the first, uncorrugated state. Alternatively, an external biased device can be used to provide a return force. An actuation or biased member 638 can also be attached to a side of the actuator 602 to provide a return force to return the actuator to the first state. The actuation or biased member 638 can be attached to an external anchor point (not shown) to uncorrugate the portions 630 and 631.

Figure 7:
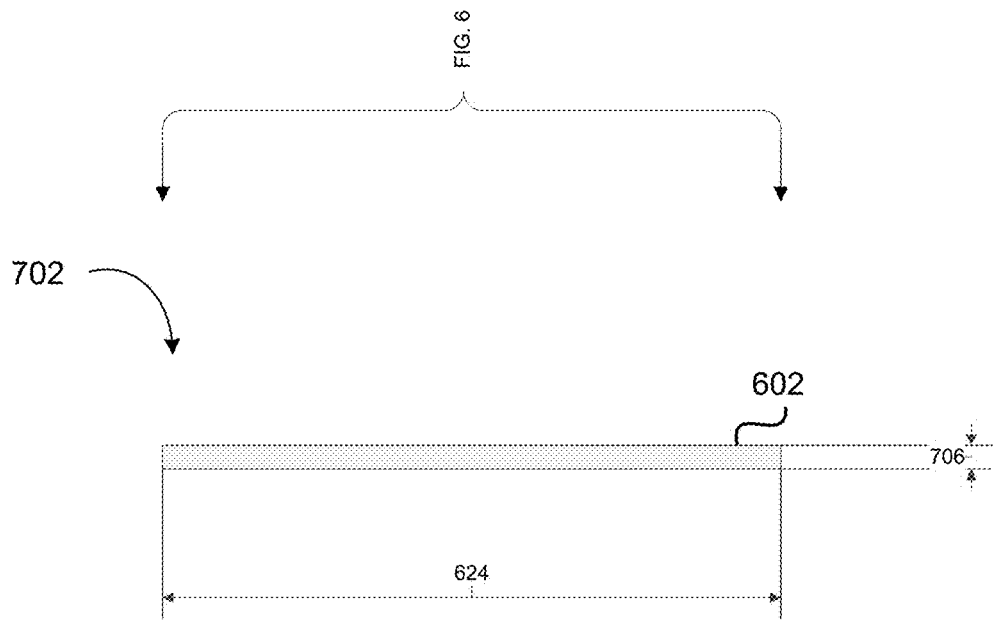
FIG. 7 illustrates a side view of the second micro actuator of FIG. 6, in two states.
Figure 7:
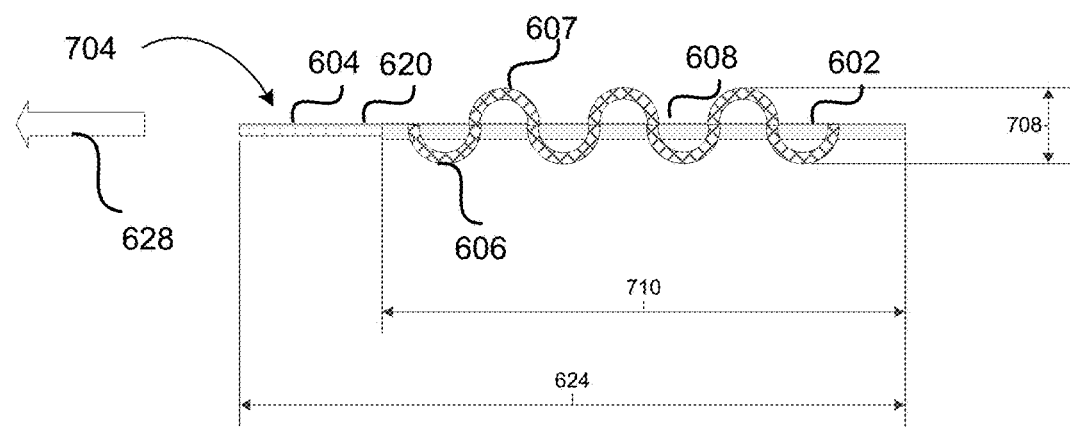

FIG. 7 illustrated a side view of the actuator 602 of FIG. 6 to better illustrate the operation of the actuator 602. Illustrated are two states of the actuator 602. In the first state 702, voltage may not be applied to the conductive layer areas 606. In this state, the actuator 602 can substantially take the form of a planar surface and can be compliant, such as in the form of a film. As such, the actuator 602 can be applied to irregular or curved surfaces.

In the second state 704, voltage has been applied to the conductive layer areas 606, causing the substrate 604 to corrugate, as illustrated. When corrugated, the actuation member 620 can extend in the direction indicated by arrow 628. In other words, the actuation member 620 can be extended in a direction substantially parallel to the planar surface illustrated by view 702. Additional guides or features (not shown) can be used to bound the angle of deflection of the actuation member 620 when it is extended. This bounding can aid in guiding the actuation member 620 to extend at a predefined angle relative to the planar surface. The actuation member 620 can extend at various angles with respect to the planar surface, up to and including thirty degrees from a reference parallel to the planar surface illustrated by the view 702. The actuation of the actuator 602 can be caused by the deformation of the portions 630 and 631 of the substrate 604 as dimension 624 decreases to dimension 710. Since the actuation member 620 may not corrugate, its dimension 624 can remain substantially similar to the length 624 of the planar surface of view 702, causing the actuation member 620 to move relative to the portions 630 and 631 of the substrate 604. The thickness 706 of the substrate 604 can be less than two hundred microns thick. The deflection 708 of the conductive layer areas 606 can be less than one hundred microns.

Using the disclosed configuration has several advantages. First, at least a layer of the device can generally be made from a unitary material. A portion of the actuation member 720 can be made unitarily from the same material as the substrate 604. This uniformity of material can increase the strength of the device and can simplify the manufacturing process, lowering production cost. Additionally, since multiple conductive layer areas 606 can be used to deflect the actuation member 620, the forces provided by applying a voltage to each conductive layer 606 can be cumulative. The force exerted by the deflection of the actuation member 620 can therefore be several times the force provided via the application of voltage to each conductive layer area 606. The direction of the force exerted by the actuation member (being away from the substrate) is also advantageous. Whereas the configurations 200 of FIG. 2 can only generate a pulling force between two objects, the actuator 602 can push an object away from the actuator 602.

It should be understood that although the actuators 302 and 602 are disclosed as forming a generally planar surface when in a first state and corrugating to form a second state, the reverse functionality is also possible. For example, the actuators 302 and 602 can be configured to corrugate when no voltage is applied and then uncorrugate when voltage is applied. A pre-biased material can be integrated into the structure to provide this functionality. Furthermore, the actuators 302 and 602 can provide bidirectional functionality by using combinations of pre-biased materials. In this manner, the actuation members 320 and 620 of the actuators 302 and 602 can be made to contract towards the actuators 302 and 602 when electrical power is applied to uncorrugate the substrates 304 and 604 of the actuators 302 and 602.

Additional embodiments are also contemplated in addition to the actuators 302 and 602. For example, a substrate can be formed into a cylindrical shape. An actuation member can be disposed longitudinally through the center of the cylinder. Alternatively, the substrate and conductive layer areas can be arranged to form pyramid or conical shapes. Stiffening materials can be strategically placed to give structural support to these embodiments as the substrate may be compliant and film-like. The stiffening and/or conductive layer areas of the substrate can be arranged in any number of patterns and/or shapes including geometric or organic shapes. Additionally, voids in the substrate can be arranged in multiple patterns and/or shapes. As one example, the entire substrate can be made circular with concentric circular conductive layer areas. In this manner, the substrate can be made to form a cone when electrical power is applied to the conductive layer areas.

The actuation members 320 and 620 can also include conductive layer areas. In this manner, the profile of the actuation member can actively be altered. As an example, the actuation member 620 could extend above or below the planar surface of the substrate depending on a polarity of voltages applied to conductive layer areas of the actuation member 620. Stiffening sections can also be used in conjunction with the conductive layer areas of the actuation member 620. Additionally, embodiments disclosed can have multiple actuation members. For example, the actuator 602 can be modified to have an actuation member extend from one side and contract from the opposite side when the actuator 602 corrugates. The actuator 302 can have actuation members 320 that extend both above and below the planar surface of the substrate 304 when the actuator 302 corrugates.

FIGS. 8-13 illustrate example steps for the manufacture of an actuation device having features of the embodiments. The manufacturing process can utilize thick film or thin film techniques. Film techniques can advantageously enable the production of micro actuators at relatively high volume and at relatively low cost. Film techniques generally consist of applying thin films of material sequentially, one on top of another. Through steps called masking and etching, certain portions of one or more layers can be selected for removal. In this manner, various structures and features can be constructed using film materials having thickness measured in microns. Such techniques are generally used for the construction of integrated circuits and Liquid Crystal Display (LCD) panels.

Figure 8:
FIG. 8 illustrates an example first step to manufacture features of embodiments of the disclosure.
Figure 9:
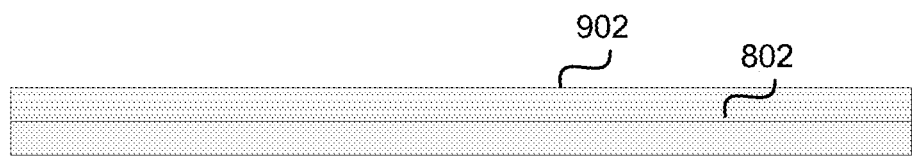
FIG. 9 illustrates an example second step to manufacture features of embodiments of the disclosure.
Figure 10:
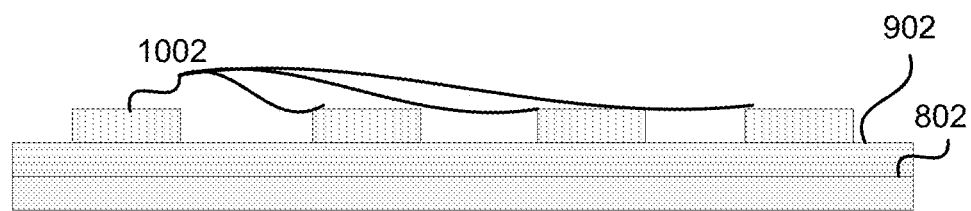
FIG. 10 illustrates an example third step to manufacture features of embodiments of the disclosure.

FIG. 8 illustrates a side view of a substrate 802 that can be used as a representative basis for the construction of a micro actuator having features of the embodiments. In FIG. 9, a conductive polymer 902 is applied on top of the substrate 802. In FIG. 10, a resistive mask 1002 has been applied on top of the conductive polymer 902. The mask 1002 can be applied to form various patterns. Although only a side dimension is illustrated in FIGS. 8-12, it should be understood that the mask can be applied in at least two dimensions, as will be illustrated in FIG. 13. Photolithography is one example of a process that can be used to create a precision mask on the surface of a substrate. The mask can be used to cover areas of the product stack for protection from etching.

Figure 11:
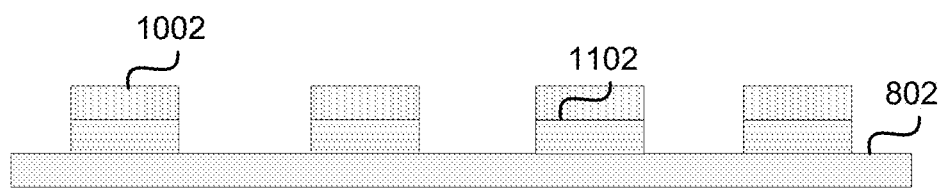
FIG. 11 illustrates an example fourth step to manufacture features of embodiments of the disclosure.
Figure 12:
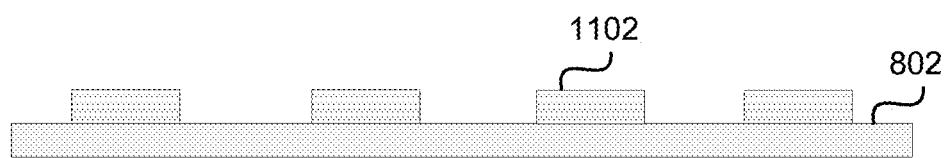
FIG. 12 illustrates an example fifth step to manufacture features of embodiments of the disclosure.

FIG. 11 illustrates the state of the product after an etch has been applied. Etching is a technique wherein a chemical or other agent is used to dissolve or remove layers of the product stack. As illustrated, etching can be used such that the conductive polymer 902 conforms to a pattern 1102 (equivalent to mask 1002). The pattern 1102 is illustrated as four distinct blocks, however, it should be understood that these blocks can represent stripes across the top surface of the substrate as only one side dimension of the substrate is illustrated in FIG. 11. FIG. 12 illustrates the removal of the mark 1002, leaving the substrate 802 and the patterned polymer 1102. It should be understood that the above, or a similar, process can be applied to both sides of the substrate 802 to form corresponding patterned polymers 1102 on both sides of the substrate 802. In this manner, a profile similar to the one illustrated in view 202 that can be used to form the basis for an actuator.

Figure 13:
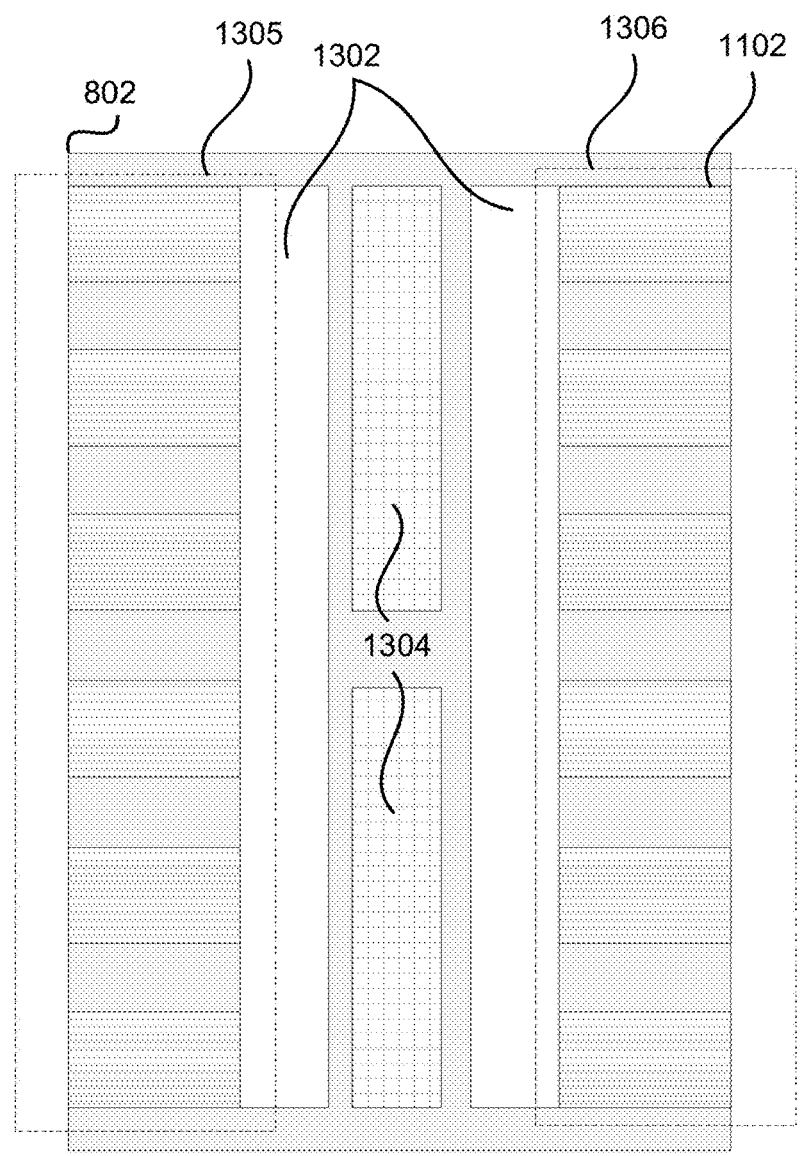
FIG. 13 illustrates additional steps to manufacture features of embodiments of the disclosure.

FIG. 13 illustrates a top view of the substrate 802. The polymer is illustrated patterned 1102 to form two linear arrays, as can be obtained using the masking and etching process described above. In addition, voids 1302 can be removed using a similar masking and etching process. Finally, a stiffening material 1304 can be applied in a similar fashion (i.e., a layer can be applied, then a mask, then an etch can be performed). Using these techniques, the actuators 302 and 602 can be manufactured at high volume and at relatively low cost.

It should be understood that various other methodologies and technologies can be used in addition or in place of the disclosed thick film techniques. Additive or subtractive methods can be used to either create patterned layers or etch patterns into an already deposited layer. In an additive method, a layer can be deposited in a specific pattern. In a subtractive method, a pattern can be created in a layer using etching and/or masking techniques. Example techniques used to manufacture such devices can include lithography, screen-printing, drying/curing, firing, laser trimming, chemical and/or physical deposition, etc.

Figure 14:
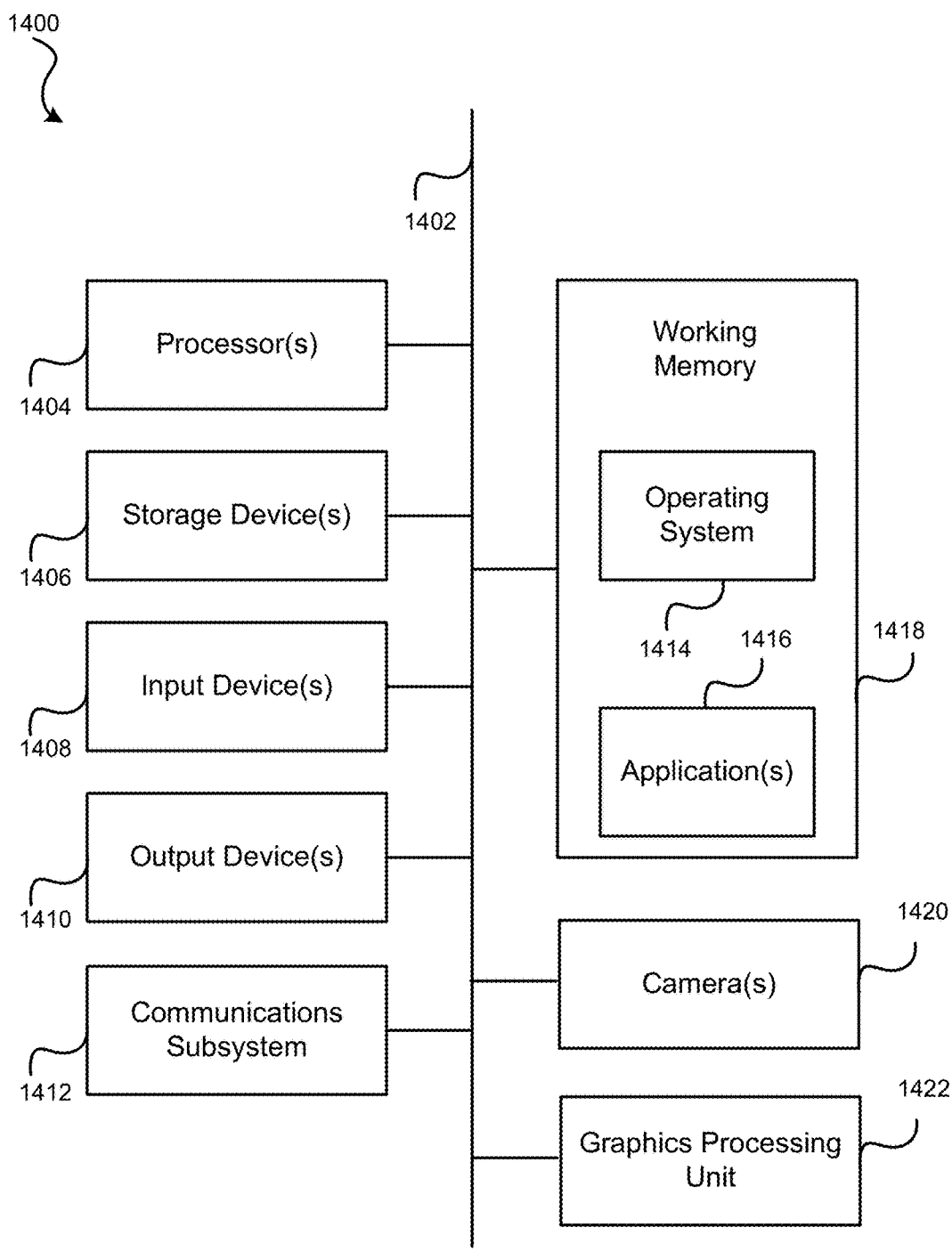
FIG. 14 illustrates an example of a computing system in which one or more embodiments may be implemented.

FIG. 14 illustrates an example of a computing system in which one or more embodiments may be implemented.

A computer system as illustrated in FIG. 14 may be incorporated as part of the above described computerized device. For example, computer system 1400 can represent some of the components of a television, a computing device, a server, a desktop, a workstation, a control or interaction system in an automobile, a tablet, a netbook or any other suitable computing system. A computing device may be any computing device with an image capture device or input sensory unit and a user output device. An image capture device or input sensory unit may be a camera device. A user output device may be a display unit. Examples of a computing device include but are not limited to video game consoles, tablets, smart phones and any other hand-held devices. FIG. 14 provides a schematic illustration of one implementation of a computer system 1400 that can perform the methods provided by various other implementations, as described herein, and/or can function as the host computer system, a remote kiosk/terminal, a point-of-sale device, a telephonic or navigation or multimedia interface in an automobile, a computing device, a set-top box, a table computer and/or a computer system. FIG. 14 is meant only to provide a generalized illustration of various components, any or all of which may be utilized as appropriate. FIG. 14, therefore, broadly illustrates how individual system elements may be implemented in a relatively separated or relatively more integrated manner.

The computer system 1400 is shown comprising hardware elements that can be electrically coupled via a bus 1402 (or may otherwise be in communication, as appropriate). The hardware elements may include one or more processors 1404, including without limitation one or more general-purpose processors and/or one or more special-purpose processors (such as digital signal processing chips, graphics processing units 1422, and/or the like); one or more input devices 1408, which can include without limitation one or more cameras, sensors, a mouse, a keyboard, a microphone configured to detect ultrasound or other sounds, and/or the like; and one or more output devices 1410, which can include without limitation a display unit such as the device used in implementations of the invention, a printer and/or the like. Additional cameras 1420 may be employed for detection of user's extremities and gestures. In some implementations, input devices 1408 may include one or more sensors such as infrared, depth, and/or ultrasound sensors. The graphics processing unit 1422 may be used to carry out the method for real-time wiping and replacement of objects described above.

In some implementations of the implementations of the invention, various input devices 1408 and output devices 1410 may be embedded into interfaces such as display devices, tables, floors, walls, and window screens. Furthermore, input devices 1408 and output devices 1410 coupled to the processors may form multi-dimensional tracking systems.

The computer system 1400 may further include (and/or be in communication with) one or more non-transitory storage devices 1406, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 1400 might also include a communications subsystem 1412, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1412 may permit data to be exchanged with a network, other computer systems, and/or any other devices described herein. In many implementations, the computer system 1400 will further comprise a non-transitory working memory 1418, which can include a RAM or ROM device, as described above.

The computer system 1400 also can comprise software elements, shown as being currently located within the working memory 1418, including an operating system 1414, device drivers, executable libraries, and/or other code, such as one or more application programs 1416, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1406 described above. In some cases, the storage medium might be incorporated within a computer system, such as computer system 1400. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 1400 and/or might take the form of source and/or installable code, which, upon compilation and/or installation on the computer system 1400 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 1400 may be omitted or may be implemented separate from the illustrated system. For example, the processor 1404 and/or other elements may be implemented separate from the input device 1408. In one implementation, the processor may be configured to receive images from one or more cameras that are separately implemented. In some implementations, elements in addition to those illustrated in FIG. 14 may be included in the computer system 1400.

Some implementations may employ a computer system (such as the computer system 1400) to perform methods in accordance with the disclosure. For example, some or all of the procedures of the described methods may be performed by the computer system 1400 in response to processor 1404 executing one or more sequences of one or more instructions (which might be incorporated into the operating system 1414 and/or other code, such as an application program 1416) contained in the working memory 1418. Such instructions may be read into the working memory 1418 from another computer-readable medium, such as one or more of the storage device(s) 1406. Merely by way of example, execution of the sequences of instructions contained in the working memory 1418 might cause the processor(s) 1404 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 1400, various computer-readable media might be involved in providing instructions/code to processor(s) 1404 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 1406. Volatile media include, without limitation, dynamic memory, such as the working memory 1418. Transmission media include, without limitation, coaxial cables, copper wire and fiber optics, including the wires that comprise the bus 1402, as well as the various components of the communications subsystem 1412 (and/or the media by which the communications subsystem 1412 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1404 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1400. These signals, which might be in the form of electromagnetic signals, acoustic signals, optical signals and/or the like, are all examples of carrier waves on which instructions can be encoded, in accordance with various implementations of the invention.

The communications subsystem 1412 (and/or components thereof) generally will receive the signals, and the bus 1402 then might carry the signals (and/or the data, instructions, etc. carried by the signals) to the working memory 1418, from which the processor(s) 1404 retrieves and executes the instructions. The instructions received by the working memory 1418 may optionally be stored on a non-transitory storage device 1406 either before or after execution by the processor(s) 1404.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

What is claimed is:

1. A micro actuator, comprising:
a substrate;
a plurality of electrodes; and
an actuation member formed on a portion of the substrate;
wherein:
a corrugating portion of the substrate in a first state is uncontracted to form a substantially planar surface and in a second state is contracted along a dimension parallel to the substantially planar surface;
the actuation member is at least partially rigid; and
wherein an application of electrical power to electrodes of the plurality of electrodes is configured to move the actuation member relative to the corrugating portion upon a change in state of the corrugating portion.

2. The micro actuator of claim 1, wherein at least a layer of the substrate is unitary and the actuation member includes at least a portion of the layer.

3. The micro actuator of claim 1, wherein the substrate comprises a conducting polymer film.

4. The micro actuator of claim 1, wherein the application of the electrical power across the electrodes of the plurality of electrodes causes a change in state of the corrugating portion of the substrate.

5. The micro actuator of claim 4, wherein the plurality of electrodes are arranged on the substrate on opposing sides of the actuation member.

6. The micro actuator of claim 1, wherein a force imparted to move the actuation member is dependent upon at least a ratio of corresponding dimensions of the corrugating portion to the substrate.

7. The micro actuator of claim 1, wherein the actuation member moves in a direction substantially parallel to the substantially planar surface.

8. The micro actuator of claim 1, wherein the actuation member is coupled to the substrate at two points and extends in a direction substantially oblique or normal to the planar surface.

9. The micro actuator of claim 1, wherein the substrate includes a first layer, a second layer, and a tertiary layer;
   wherein the substrate is configured to induce an electrical charge on the first layer or the second layer when a voltage difference is applied between the first layer and the second layer; and
   wherein the tertiary layer is disposed between the first and second layer.

10. The micro actuator of claim 9, wherein the first layer or the second layer is configured to expand or contract upon an application of an electric charge between the first layer and the second layer.

11. The micro actuator of claim 9, wherein the first layer is divided into a plurality of electrically isolated portions.

12. The micro actuator of claim 1, wherein a thickness of the substrate is less than three hundred microns.

13. The micro actuator of claim 1, wherein the micro actuator is biased for the corrugating portion to be in the first state or the second state.

14. The micro actuator of claim 1, wherein the substrate defines one or more voids.

15. A micro actuator, comprising:
   a substrate;
   an actuation member formed on a portion of the substrate, wherein the actuation member is at least partially rigid;
   a means to induce a corrugating portion of the substrate between a first state wherein the substrate substantially forms a substantially planar surface and a second state wherein the substrate is contracted along a dimension parallel to the substantially planar surface; and
   a means to move the actuation member relative to the corrugating portion upon a change in state of the corrugating portion.

16. The micro actuator of claim 15, wherein at least a layer of the substrate is unitary and the actuation member includes at least a portion of the layer.

17. The micro actuator of claim 15, further comprising a plurality of electrodes and wherein application of electrical power across electrodes of the plurality of electrodes causes a change in state of the corrugating portion of the substrate.

18. The micro actuator of claim 15, wherein a force imparted to move the actuation member is dependent upon at least a ratio of corresponding dimensions of the corrugating portion to the substrate.

19. The micro actuator of claim 15, wherein the actuation member moves in a direction substantially parallel to the substantially planar surface.

20. The micro actuator of claim 15, wherein the actuation member is coupled to the substrate at two points and extends in a direction substantially oblique or normal to the planar surface.

21. The micro actuator of claim 15, wherein the substrate includes a first layer, a second layer, and a tertiary layer;
   wherein the substrate is configured to induce an electrical charge on the first layer or the second layer when a voltage difference is applied between the first layer and the second layer;
   wherein the first layer or the second layer is configured to expand or contract upon an application of an electric charge between the first layer and the second layer; and
   wherein the tertiary layer is disposed between the first and second layer.

* * * * *